(12) United States Patent  
Takahashi

(10) Patent No.: US 11,699,698 B2
(45) Date of Patent: *Jul. 11, 2023

(54) SEMICONDUCTOR DEVICE

(71) Applicant: Rohm Co., Ltd., Kyoto (JP)

(72) Inventor: Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/890,614

(22) Filed: Aug. 18, 2022

(65) Prior Publication Data

US 2022/0406770 A1  Dec. 22, 2022

Related U.S. Application Data

(63) Continuation of application No. 17/181,314, filed on Feb. 22, 2021, now Pat. No. 11,469,224, which is a (Continued)

(30) Foreign Application Priority Data

Oct. 1, 2015 (JP) .................................. 2015-196077

(51) Int. Cl.
*H01L 27/02* (2006.01)
*H01L 29/78* (2006.01)
(Continued)

(52) U.S. Cl.
CPC ........ *H01L 27/0296* (2013.01); *H01L 21/822* (2013.01); *H01L 21/8234* (2013.01); (Continued)

(58) Field of Classification Search
CPC ............... H01L 27/0296; H01L 21/822; H01L 21/8234; H01L 23/34; H01L 24/06; (Continued)

(56) References Cited

U.S. PATENT DOCUMENTS 5,642,252 A  6/1997 Sakamoto et al.
6,046,470 A  4/2000 Williams et al.
(Continued)

FOREIGN PATENT DOCUMENTS

EP  2922093  9/2015
JP  H07-058293  3/1995
(Continued)

OTHER PUBLICATIONS

Dilip Madhav Risbud; HTMT temperature sensor; publication date: Sep. 23, 2015; drawings, specification (Year: 2015).

(Continued)

*Primary Examiner* — Dharti H Patel
(74) *Attorney, Agent, or Firm* — Fish & Richardson P.C.

(57) ABSTRACT

A semiconductor device 100 has a power transistor N1 of vertical structure and a temperature detection element 10*a* configured to detect abnormal heat generation by the power transistor N1. The power transistor N1 includes a first electrode 208 formed on a first main surface side (front surface side) of a semiconductor substrate 200, a second electrode 209 formed on a second main surface side (rear surface side) of the semiconductor substrate 200, and pads 210*a*-210*f* positioned unevenly on the first electrode 208. The temperature detection element 10*a* is formed at a location of the highest heat generation by the power transistor N1, the location (near the pad 210*b* where it is easiest for current to be concentrated) being specified using the uneven positioning of the pads 210*a*-210*f*.

16 Claims, 13 Drawing Sheets

Related U.S. Application Data continuation of application No. 15/764,397, filed as application No. PCT/JP2016/078446 on Sep. 27, 2016, now Pat. No. 10,964,688.

(51) Int. Cl.

| | | |
|---|---|---|
| *H01L 27/088* | (2006.01) | |
| *H01L 21/8234* | (2006.01) | |
| *H01L 21/822* | (2006.01) | |
| *H01L 27/06* | (2006.01) | |
| *H01L 27/04* | (2006.01) | |
| *H01L 23/34* | (2006.01) | |
| *H01L 23/00* | (2006.01) | |
| *H01L 27/07* | (2006.01) | |
| *H01L 29/06* | (2006.01) | |
| *H02H 5/04* | (2006.01) | |
| *B60R 16/033* | (2006.01) | |

(52) U.S. Cl.
CPC ............ *H01L 23/34* (2013.01); *H01L 24/06* (2013.01); *H01L 27/0255* (2013.01); *H01L 27/0259* (2013.01); *H01L 27/0292* (2013.01); *H01L 27/04* (2013.01); *H01L 27/06* (2013.01); *H01L 27/0629* (2013.01); *H01L 27/0711* (2013.01); *H01L 27/088* (2013.01); *H01L 29/0696* (2013.01); *H01L 29/78* (2013.01); *H01L 29/7813* (2013.01); *H02H 5/044* (2013.01); *B60R 16/033* (2013.01); *H01L 2224/0603* (2013.01); *H01L 2224/06153* (2013.01)

(58) Field of Classification Search
CPC ............ H01L 27/0255; H01L 27/0259; H01L 27/0292; H01L 27/04; H01L 27/06; H01L 27/0629; H01L 27/0711; H01L 27/088; H01L 29/0696; H01L 29/78; H01L 29/7813; H01L 2224/0603; H01L 2224/06153; H01L 27/0211; H02H 5/044; B60R 16/033
USPC .................................................. 361/56, 103
See application file for complete search history.

(56) References Cited

U.S. PATENT DOCUMENTS

| | | | |
|---|---|---|---|
| 10,964,688 B2* | 3/2021 | Takahashi | H01L 27/0259 |
| 11,469,224 B2* | 10/2022 | Takahashi | H01L 23/34 |
| 2005/0258464 A1 | 11/2005 | Zundel et al. | |
| 2007/0296040 A1 | 12/2007 | Tametani et al. | |
| 2010/0321846 A1* | 12/2010 | Fukami | H03K 17/0822 |
| | | | 327/512 |
| 2011/0215400 A1* | 9/2011 | Nakamura | H01L 24/40 |
| | | | 257/334 |
| 2012/0133427 A1 | 5/2012 | Kim et al. | |
| 2013/0001792 A1* | 1/2013 | Uno | H01L 24/40 |
| | | | 257/773 |
| 2013/0043576 A1 | 2/2013 | Nakamura et al. | |
| 2014/0184312 A1 | 7/2014 | Kim et al. | |
| 2015/0014687 A1* | 1/2015 | Nakajima | H05B 47/25 |
| | | | 257/48 |
| 2015/0270254 A1* | 9/2015 | Risbud | H01L 27/0605 |
| | | | 257/76 |
| 2018/0269200 A1 | 9/2018 | Takahashi | |
| 2021/0175229 A1 | 6/2021 | Takahashi | |

FOREIGN PATENT DOCUMENTS

| | | |
|---|---|---|
| JP | 2006-100690 | 4/2006 |
| JP | 2008-004728 | 1/2008 |
| JP | 2008-244487 | 10/2008 |
| JP | 2011-003767 | 1/2011 |
| JP | 2012-114446 | 6/2012 |
| JP | 2013-012669 | 1/2013 |
| KR | 1020110102188 | 9/2011 |

OTHER PUBLICATIONS

European Search Report; ESSR for EP 16851529.4 dated Mar. 7, 2019.

Japan Patent Office, International Search Report for PCT/JP2016/078446 dated Dec. 20, 2016 with English translation.

Korean Patent Office, Office Action issued for KR10-2018-7008664 dated May 8, 2019, 19 pages, with English Translation.

\* cited by examiner

SEMICONDUCTOR DEVICE

CROSS-REFERENCE TO RELATED APPLICATIONS

This application is a continuation application of U.S. application Ser. No. 17/181,314, filed Feb. 22, 2021, which is a continuation of U.S. application Ser. No. 15/764,397, filed Mar. 29, 2018, now U.S. Pat. No. 10,964,688, which is a U.S. National Phase application under 35 U.S.C. § 371 of International Patent Application No. PCT/JP2016/078446, filed on Sep. 27, 2016, which claims the priority of Japanese Patent Application No. 2015-196077, filed on Oct. 1, 2015, the disclosure of which is incorporated herein by reference in its entirety.

TECHNICAL FIELD

The present invention relates to semiconductor devices.

BACKGROUND ART

Conventionally, many semiconductor devices including a power transistor are provided with a temperature sensing element for detecting abnormal heat generation in the power transistor.

Examples of the just mentioned conventional technology are seen in Patent Documents 1 and 2 identified below.

LIST OF CITATIONS

Patent Literature

Patent Document 1: Japanese Patent Application published as No. 2006-100690
Patent Document 2: Japanese Patent Application published as No. 2011-003767

SUMMARY OF THE INVENTION

Technical Problem

However, conventional semiconductor devices leave room for further improvement in terms of the accuracy of abnormal heat generation detection (and hence the reliability of temperature protection circuits).

In view of the problem encountered by the present inventor, an object of the invention described herein is to provide a semiconductor device that can properly detect abnormal heat generation in a power transistor.

Means for Solving the Problem

According to one aspect of the invention disclosed herein, a semiconductor device includes: a power transistor with a vertical structure; and a temperature sensing element configured to detect abnormal heat generation in the power transistor. The power transistor includes: a first electrode formed on the first-principle-face side of a semiconductor substrate; a second electrode formed on the second-principle-face side of the semiconductor substrate; and at least one pad arranged in a lopsided manner on the first electrode. The temperature sensing element is formed at the most heat-generating spot in the power transistor that is identified by the lopsided arrangement of the pad (a first configuration).

In the semiconductor device according to the first configuration, the pad can comprise a plurality of pads, and the pads can be arranged in a lopsided manner such that one pad on which current tends to concentrate most is uniquely identifiable (a second configuration).

In the semiconductor device according to the first configuration, the pad can comprise one pad, and the pad can arranged in a lopsided manner such that the current density distribution around the pad is lopsided in a particular direction (a third configuration).

In the semiconductor device according to any one of the first to third configuration, the second electrode can be a substrate electrode for applying a supply voltage to the semiconductor substrate (a fourth configuration).

The semiconductor device according to the fourth configuration can further include: a power line formed on the first-principle-face side of the semiconductor substrate; and a via connecting between the substrate electrode and the power line (a fifth configuration).

In the semiconductor device according to any one of the first to fifth configuration, the power transistor can function as a high-side switch of which the first electrode is connected to a load and of which the second electrode is connected to a power terminal (a sixth configuration).

In the semiconductor device according to any one of the first to fifth configuration, the power transistor can function as a low-side switch of which the first electrode is connected to a ground terminal and of which the second electrode is connected to a load (a seventh configuration).

In the semiconductor device according to any one of the first to seventh configuration, the first electrode can have formed therein a slit through which a conductor from the temperature sensing element is led up to an edge of the first electrode (an eighth configuration).

In the semiconductor device according to the eighth configuration, the temperature sensing element can be disposed in the vicinity of the pad, and the slit can be formed to extend in the direction opposite to the pad (a ninth configuration).

In the semiconductor device according to the second configuration, the plurality of pads can be arranged in a lopsided manner on the first electrode such that current concentrates most at the corner of the pad, among the plurality of pads, that is closest to a temperature protection circuit (a tenth configuration).

In the semiconductor device according to the tenth configuration, the temperature sensing element can be disposed in the vicinity of the corner (an eleventh configuration).

In the semiconductor device according to the tenth or eleventh configuration, the temperature sensing element can be arranged along, of a plurality of directions pointing from the corner to edges of the first electrode, the direction along which the distance from the corner to the edge is longer (a twelfth configuration).

In the semiconductor device according to any one of the tenth to twelfth configuration, the plurality of pads can comprise a main pad and a sub pad, with the sub pad smaller than the main pad (a thirteenth configuration).

According to another aspect of the invention disclosed herein, a semiconductor device includes: a power transistor with a horizontal structure; and a temperature sensing element configured to detect abnormal heat generation in the power transistor. The power transistor includes: a channel region formed on a semiconductor substrate; an electrode laid from the channel region toward an edge of the semiconductor substrate; a pad row arrayed on the electrode; and a current concentration pad arranged closer, than the pad row, to the channel region (a fourteenth configuration).

The semiconductor device according to any one of the first to fourteenth configurations may further include a temperature protection circuit configured to forcibly turn OFF the power transistor when the temperature sensing element detects abnormal heat generation in the power transistor (a fifteenth configuration).

According to yet another aspect of the invention disclosed herein, an electronic appliance includes the semiconductor device according to the fifteenth configuration (a sixteenth configuration).

According to a further aspect of the invention disclosed herein, a vehicle includes: a battery; and the electronic appliance according the sixteenth configuration, the electronic appliance operating by being fed with a supply voltage from the battery (a seventeenth configuration).

Advantageous Effects of the Invention

With a semiconductor device according to what is disclosed herein, it is possible to properly detect abnormal heat generation in a power transistor, and to enhance the reliability of a temperature protection circuit.

DESCRIPTION OF EMBODIMENTS

<Semiconductor Device>

Figure 1:
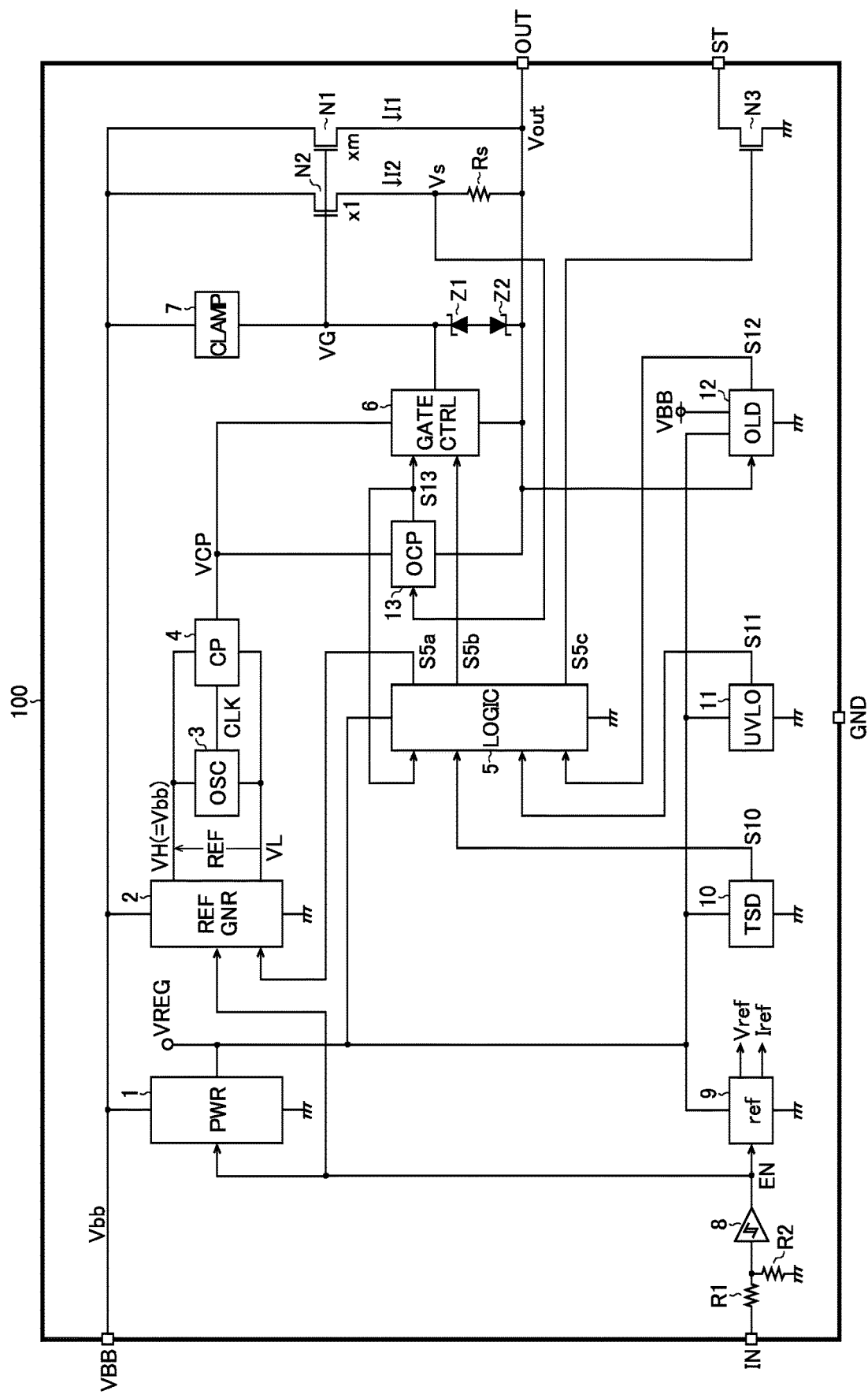
FIG. 1 is a block diagram showing an overall configuration of a semiconductor device.

FIG. 1 is a block diagram showing an overall configuration of a semiconductor device. The semiconductor device 100 of this configuration example is a vehicle-mounted high-side switch IC, and includes, as means for establishing electrical connection with outside the device, a plurality of external terminals (an IN pin, a GND pin, an OUT pin, an ST pin, and a VBB pin). The IN pin is an input terminal for accepting external input of a control signal from a CMOS logic IC or the like. The GND pin is a ground terminal. The OUT pin is an output terminal to which a load (such as an engine control ECU (electronic control unit), an air conditioner, or a body device) is externally connected. The ST pin is an output terminal for external output of a self diagnosis signal to a CMOS logic IC or the like. The VBB pin is a power terminal for receiving the supply of a supply voltage Vbb (for example, 4.5 V to 18 V) from a battery. The VBB pin may comprise a plurality of VBB pins in parallel (for example, four pins in parallel) to accommodate a high current.

The semiconductor device 100 of this configuration example is composed of the following components integrated together: an internal power supply circuit 1, a constant voltage generation circuit 2, an oscillation circuit 3, a charge-pump circuit 4, a logic circuit 5, a gate control circuit 6, a clamp circuit 7, an input circuit 8, a reference generation circuit 9, a temperature protection circuit 10, a reduced-voltage protection circuit 11, an open protection circuit 12, an overcurrent protection circuit 13, N-channel MOS field-effect transistors N1 to N3, resistors R1 and R2, a sense resistor Rs, and Zener diodes Z1 and Z2.

The internal power supply circuit 1 is connected between the VBB pin and the GND pin. The internal power supply circuit 1 generates from the supply voltage Vbb a predetermined internal supply voltage VREG to feed it to different parts in the semiconductor device 100. Whether or not to operate the internal power supply circuit 1 is controlled according to the logic level of an enable signal EN. Specifically, the internal power supply circuit 1 is in an operating state when the enable signal EN is at an enabling logic level (for example, HIGH level), and is in a non-operating state when the enable signal EN is at a disabling logic level (for example, LOW level).

The constant voltage generation circuit 2 is connected between the VBB pin and the GND pin. The constant voltage generation circuit 2 generates a high voltage VH (=the supply voltage Vbb) commensurate with the supply voltage Vbb and a low voltage VL (=Vbb−REF) lower than the high voltage VH by a constant voltage REF (for example, 5 V) to feed them to the oscillation circuit 3 and the charge-pump circuit 4. Whether or not to operate the constant voltage generation circuit 2 is controlled according to the logic levels of the enable signal EN and a fault protection signal S5a. Specifically, the constant voltage generation circuit 2 is in an operating state when the enable signal EN is at an enabling logic level (for example, HIGH level) or the fault protection signal S5a is at a no-fault logic level (for example, HIGH level), and is in a non-operating state when the enable signal EN is at a disabling logic level (for example, LOW level) or the fault protection signal S5a is at a fault-detected logic level (for example, low level).

The oscillation circuit 3 operates by being fed with the high voltage VH and the low voltage VL. The oscillation circuit 3 generates a clock signal CLK at a predetermined frequency to output it to the charge-pump circuit 4. The clock signal CLK is a square-wave signal that is pulse-driven between the high voltage VH and the low voltage VL.

The charge-pump circuit 4 operates by being fed with the high voltage VH and the low voltage VL. The charge-pump circuit 4 drives a flying capacitor by using the clock signal CLK, and thereby generates a stepped-up voltage VCP higher than the supply voltage Vbb to feed the stepped-up voltage VCP to the gate control circuit 6 and the overcurrent protection circuit 13.

The logic circuit 5 operates by being fed with the internal supply voltage VREG. The logic circuit 5 generates a gate control signal S5b to output it to the gate control circuit 6. The gate control signal S5 is a binary signal that is at HIGH level (=VREG) when turning ON the transistors N1 and N2 and that is at LOW level (=GND) when turning OFF the transistors N1 and N2. The logic circuit 5 is also given a function of monitoring a temperature protection signal S10, a reduced-voltage protection signal S11, an open protection signal S12, and an overcurrent protection signal S13 individually to perform fault protection operation as necessary. Specifically, when a fault is detected in the semiconductor device 100, the logic circuit 5 turns the fault protection signal S5a to the fault-detected logic level to stop the constant voltage generation circuit 2, and also turns the gate control signal S5b to LOW level to forcibly turn OFF both of the transistors N1 and N2. The logic circuit 5 is further given a function of generating a gate signal S5c for the transistor N3 according to the result of fault detection.

The gate control circuit 6 is connected between an application terminal of the stepped-up voltage VCP and the OUT pin (=an application terminal of an output voltage Vout). The gate control circuit 6 generates a gate voltage VG by increasing the current capacity of the gate control signal S5b, and outputs the gate voltage VG to the gates of the transistors N1 and N2. The gate voltage VG is at HIGH level (=VCP) when the gate control signal S5b is at HIGH level, and is at LOW level (=Vo) when the gate control signal S5b is at LOW level. Whether or not to operate the gate control circuit 6 is controlled according to the logic level of the overcurrent protection signal S13. Specifically, the gate control circuit 6 is in an operating state when the overcurrent protection signal S13 is at a no-fault logic level (for example, LOW level), and is in a non-operating state when the overcurrent protection signal S13 is at a fault-detected logic level (for example, HIGH level).

The clamp circuit 7 is connected between the VBB pin and the gates of both of the transistors N1 and N2. In applications where an inductive load is connected to the OUT pin, when the transistor N1 is switched from ON to OFF, a back electromotive force in the inductive load causes a negative voltage to appear at the OUT pin. To cope with this, that is, to absorb energy, the clamp circuit 7 (a so-called active clamp circuit) is provided. The active clamp voltage, which is given by Vbb−(Vclp+Vgs), can be set at, for example, 48 V (where Vbb represents the supply voltage, Vclp represents the negative-side clamp voltage at the OUT pin, and vgs represents the gate-source voltage of the transistor N1).

The input circuit 8 is a Schmitt trigger that accepts input of a control signal from the IN pin to generate the enable signal EN.

The reference generation circuit 9 operates by being fed with the internal supply voltage VREG. The reference generation circuit 9 generates a predetermined reference voltage Vref and a predetermined reference current Iref to feed them to different parts in the semiconductor device 100. The reference voltage Vref and the reference current Iref are used, for example, to set a target value for the internal supply voltage VREG in the internal power supply circuit 1 and to set threshold values for fault detection in the various protection circuits 9 to 13.

The temperature protection circuit 10 operates by being fed with the internal supply voltage VREG. The temperature protection circuit 10 includes a temperature sensing element (unillustrated) configured to detect abnormal heat generation in the transistor N1, and generates, according to its sensing result (whether or not abnormal heat generation is occurring), the temperature protection signal S10 to output it to the logic circuit 5. The temperature protection signal S10 is, for example, a binary signal that is at LOW level (=GND) when no fault is being detected and that is at HIGH level (=VREG) when a fault is being detected.

The reduced-voltage protection circuit 11 operates by being fed with the internal supply voltage VREG. The reduced-voltage protection circuit 11 generates, according to a result of monitoring the supply voltage Vbb or the internal supply voltage VREG (=whether or not a reduced-voltage fault is occurring), the reduced-voltage protection signal S11 to output it to the logic circuit 5. The reduced-voltage protection signal S11 is, for example, a binary signal that is at LOW level (=GND) when no fault is being detected and that is at a HIGH level (=VREG) when a fault is being detected.

The open protection circuit 12 operates by being fed with the supply voltage Vbb and the internal supply voltage VREG. The open protection circuit 12 generates, according to a result of monitoring the output voltage Vout (=whether or not an open fault in the load is occurring), the open protection signal S12 to output it to the logic circuit 5. The open protection signal S12 is, for example, a binary signal that is at LOW level (=GND) when no fault is being detected and that is at HIGH level (=VREG) when a fault is being detected.

The overcurrent protection circuit 13 is connected between an application terminal of the stepped-up voltage VCP and the OUT pin (=an application terminal of the output voltage Vout). The overcurrent protection circuit 13 generates, according to a result of monitoring a sense voltage Vs (=whether or not an overcurrent is occurring), the overcurrent protection signal S13 to output it to the logic circuit 5. The overcurrent protection signal S13 is, for example, a binary signal that is at LOW level (=GND) when no fault is being detected and that is at HIGH level (=VREG) when a fault is being detected).

The transistor N1 is a power transistor of which the drain is connected to the VBB pin and of which the source is connected to the OUT pin. The transistor N1 functions as a switching element (high-side switch) for switching between a conducting and a cut-off state the current path of an output current I1 from the battery to the load. The transistor N1 is ON when the gate voltage VG is at HIGH level, and is OFF when the gate voltage VG is at LOW level.

The higher the ON resistance of the transistor N1, the more likely an overcurrent, and hence abnormal heat generation, is to occur when the OUT pin is short-circuited to ground (when it is short-circuited to a ground terminal or any similar low-potential terminal). Accordingly, the further the ON resistance of the transistor N1 is reduced, the higher the importance of the temperature protection circuit 10 and the overcurrent protection circuit 13.

The transistor N2 is a mirror transistor that is connected in parallel with the transistor N1, and generates a mirror current I2 commensurate with the output current I1. The size ratio of the transistor N1 to the transistor N2 is m: 1 (where m>1; for example, m=1000). Accordingly, the mirror current I2 has 1/m of the magnitude of the output current I1. The transistor N2, like the transistor N1, is ON when the gate voltage VG is at HIGH level, and is OFF when the gate voltage VG is at LOW level.

The transistor N3 is an open-drain transistor of which the drain is connected to the ST pin and of which the source is connected to the GND pin. The transistor N3 is ON when the gate signal S5c is at HIGH level, and is OFF when the gate signal S5c is at LOW level. That is, the self diagnosis signal that is output externally from the ST pin is at LOW level when the gate signal S5c is at HIGH level (=when the transistor N3 is ON), and is at HIGH level when the gate signal S5c is at LOW level (=when the transistor N3 is OFF).

The resistor R1 is connected between the IN pin and the input terminal of the input circuit 8, and functions as a current limiting resistor for suppressing an excessively high surge current or the like.

The resistor R2 is connected between the input terminal of the input circuit 8 and the GND pin, and functions as a pull-down resistor that settles at LOW level (the disabling logic level) the input logic level to the input circuit 8 when the IN pin is in an open state.

The sense resistor Rs is connected between the source of the transistor N2 and the OUT pin, and functions as a current sensing element that generates the sense voltage Vs (=I2× Rs) commensurate with the mirror current I2.

The Zener diode Z1 is connected between the gates of the transistors N1 and N2 and the OUT pin, with the cathode pointing to the gates of the transistors N1 and N2 and the anode pointing to the OUT pin. So connected, the Zener diode Z1, in a forward-connected state where a battery is connected to the VBB pin and a load is connected to the OUT pin, functions as a clamping element (surge voltage absorbing element) that limits the gate-source voltages of the transistors N1 and N2 equal to or lower than a predetermined upper limit value.

The Zener diode Z2 is connected between the gates of the transistors N1 and N2 and the OUT pin, with the anode pointing to the gates of the transistors N1 and N2 and the cathode pointing to the OUT pin. So connected, the Zener diode Z2, in a reverse-connected state where a load is connected to the VBB pin and a battery is connected to the OUT pin, functions as a reverse connection protection element that cuts off the current path leading from the OUT pin to the gates of the transistors N1 and N2.

As described above, the semiconductor device 100 is configured as a monolithic power IC in which CMOS logic components (such as the logic circuit 5) and power MOS devices (such as the transistor N1) are built on one chip.

<Power Transistor (First Embodiment)>

Figure 2:
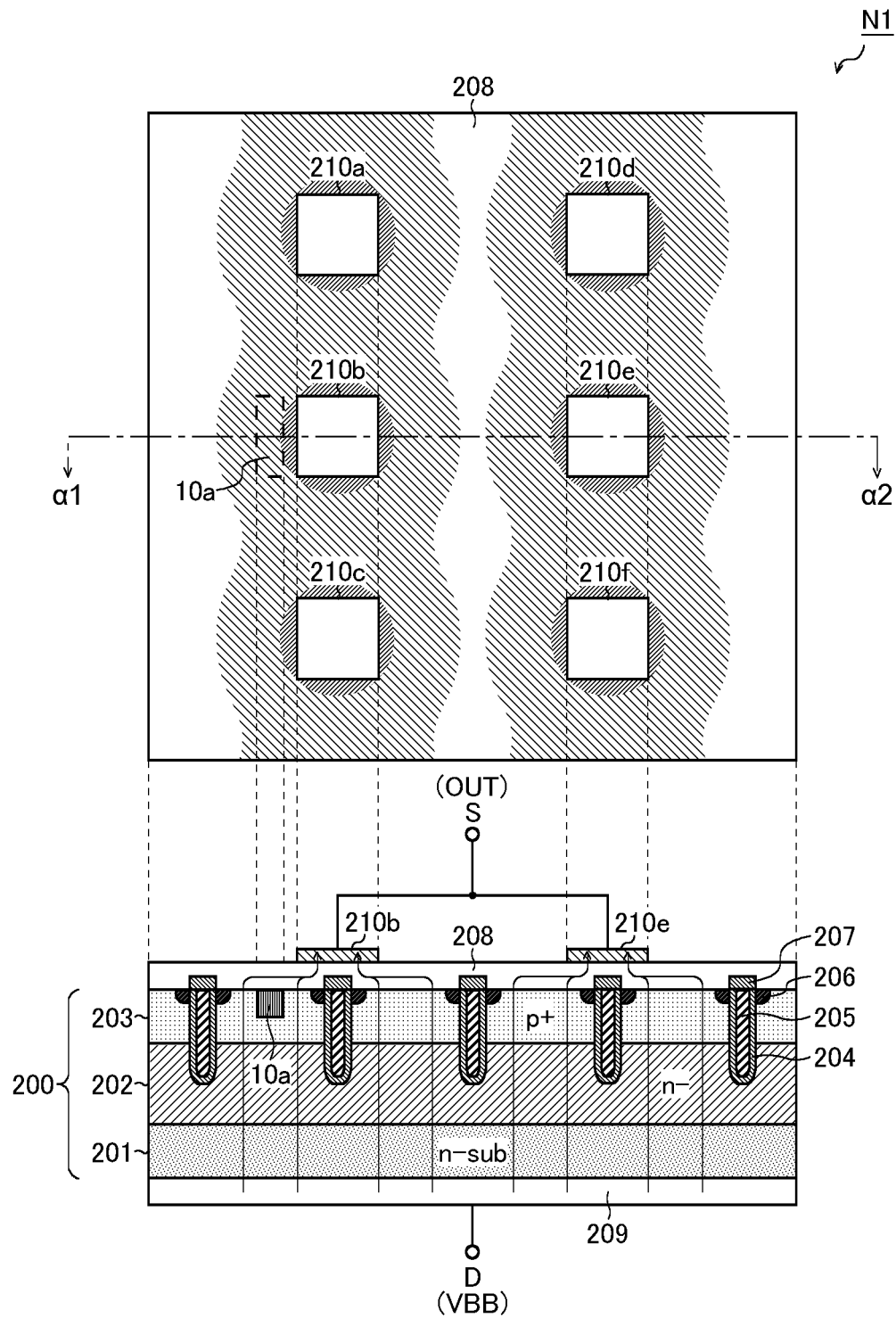
FIG. 2 is a schematic diagram showing a transistor N1 according to a first embodiment.

FIG. 2 is a schematic diagram showing the transistor N1 according to a first embodiment. In an upper section of the diagram is a top view of the transistor N1, depicting the pad arrangement layout and the current density distribution (and hence temperature distribution) around pads. In the hatched regions in the top view, increasingly dense (dark) hatching indicates increasingly high current density. On the other hand, in a lower section of the diagram is a longitudinal sectional view of the transistor N1 as cut across the dash-dot line α1-α2 in the top view. For the sake of convenient illustration, the thicknesses of layers, the sizes and numbers of trench gates, the sizes and numbers of pads, the size of a temperature sensing element 10a, and the like are not always true to life.

The transistor N1 in this embodiment is a power transistor with a vertical structure (of a trench gate type). The transistor N1 has a semiconductor substrate 200, a source electrode 208 (corresponding to a first electrode) formed on the obverse-face side (corresponding to a first-principal-face side) of the semiconductor substrate 200, a drain electrode (corresponding to a second electrode) 209 formed on the reverse-face side (corresponding to a second-principal-face side) of the semiconductor substrate 200; and a plurality of pads 210a to 210f for wire bonding that are formed on the source electrode 208.

The semiconductor substrate 200 includes, as its base, an n-type semiconductor substrate layer 201. On the obverse face of the n-type semiconductor substrate layer 201, a low-doped n-type semiconductor layer 202 is formed. Further on the obverse face of the low-doped n-type semiconductor layer 202, a high-doped p-type semiconductor layer 203 is formed Moreover, in the semiconductor substrate 200, there are formed a plurality of trench gates that extend from the obverse face of the high-doped p-type semiconductor layer 203 to the low-doped n-type semiconductor layer 202. The trench gates have their inter wall faces coated with gate oxide film 204, and are filled inside with gate polysilicon 205. Near the obverse face of the high-doped p-type semiconductor layer 203, around the trench gates, there are formed high-doped n-type semiconductor regions 206. The trench gates are, at the obverse face, coated with interlayer insulating film 207.

Furthermore, on the obverse face of the semiconductor substrate 200, a source electrode 208 is formed so as to coat the entire power transistor formation region. On the other hand, on the reverse face of the semiconductor substrate 200, a drain electrode 209 is formed so as to coat the entire power transistor formation region.

In the transistor N1 with a vertical structure as described above, a plurality of trench gates form a unit cell, and a large number of such unit cells are connected in parallel to form one power transistor. Notably, the transistor N1 of a trench gate type allows miniaturization of unit cells, and this helps achieve a lower ON resistance (several tens of milliohms) in the transistor N1.

In the transistor N1 in this embodiment, on the source electrode 208, there are arranged six pads 210a to 210f in a lattice like array (vertically three by horizontally two) at even intervals in the up-down and left-right directions. When this arrangement layout is adopted, the current passing from the drain electrode 209 to the source electrode 208 passes evenly through the power transistor formation region. Thus, the current density distribution around each of the pads 210a to 210f is even in all directions. It is thus possible to spread out heat-generating spots over the transistor N1, and thereby to enhance the safety and prolong the lifetime of the semiconductor device 100.

As indicated by the hatched regions in the top view, the transistor N1 tends to generate heat near the pads 210a to 210f. In view of this, it is preferable that a temperature sensing element 10a (for example, a bipolar transistor of which the base-emitter voltage Vbe has temperature dependence) for sensing abnormal heat generation in the transistor N1 be provided near whichever of the paragraph pads 210a to 210f generates the most heat.

In the transistor N1 in this embodiment, owing to the pads 210a to 210f being arranged evenly over the source electrode 208, there are a plurality of spots that generate heat similarly. Accordingly, in the illustrated example, on the assumption that there is no difference among the pads 210a to 210f in the current density distribution (and hence temperature distribution) around them, the temperature sensing element 10a is formed in the power transistor formation region in a close left-side vicinity of the pad 210b.

However, due to manufacturing variations and the like of the transistor N1, if current concentrates elsewhere than in the pad 210b, or if the current density distribution around the pad 210b becomes uneven, a state may result where the most heat-generating spot in the transistor N1 cannot be monitored properly (=a state where a spot with a lower temperature is being monitored). This state may cause a delay in the abnormal heat generation detection by the temperature sensing element 10a, possibly leading to thermal destruction of the transistor N1.

<Power Transistor (Second Embodiment)>

Figure 3:
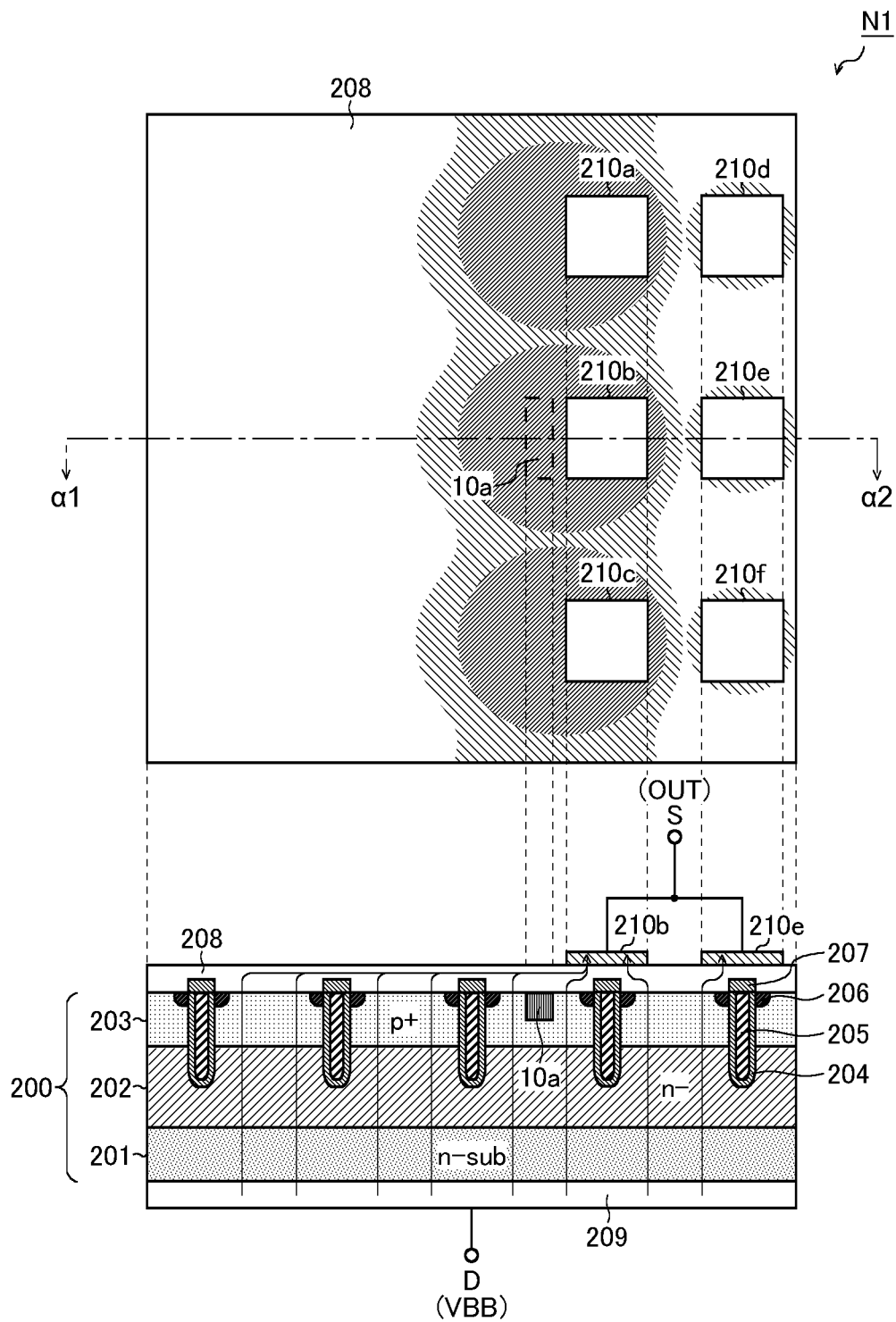
FIG. 3 is a schematic diagram showing a transistor N1 according to a second embodiment.

FIG. 3 is a schematic diagram showing the transistor N1 according to a second embodiment. The transistor N1 in this embodiment is based on that of the first embodiment (FIG. 2) described previously, and is characterized by an ingenious arrangement layout of the pads 210a to 210f. Accordingly, such constituent elements of the second embodiment as find their counterparts in the first embodiment are identified by the same reference signs as in FIG. 2, and no overlapping description will be repeated; the following description focuses on features unique to the second embodiment.

In the transistor N1 in this embodiment, the pads 210a to 210f are not arranged evenly over the entire surface of the source electrode 208, but are arranged in a manner lopsided in the right half of the surface of the source electrode 208. Owing to this lopsided arrangement, the current that passes from the drain electrode 209 to the left half of the surface of the source electrode 208 passes in a concentrated manner into, of all the pads 210a to 210f, those 210a to 210c arrayed in the left column, from their respective left-side directions.

Accordingly, the current density distribution around each of the pads 210a to 210f is such that a close left-side vicinity of the pads 210a to 210c is a region with the highest current density, and hence is the most heat-generating spot in the transistor N1. In view of this, in the illustrate example, the temperature sensing element 10a is formed in the power transistor formation region in a close left-side vicinity of the pad 201b.

As described above, by adopting the arrangement layout of the pads 210a to 210f according to this embodiment, it is possible to intentionally limit to the pads 210a to 210c the pads in which current tends to concentrate, and to narrow down the most heat-generating spot at which to form the temperature sensing element 10a. It is thus possible to enhance the accuracy of the abnormal heat generation detection by the temperature sensing element 10a (hence the reliability of the temperature protection circuit 10).

<Power Transistor (Third Embodiment)>

Figure 4:
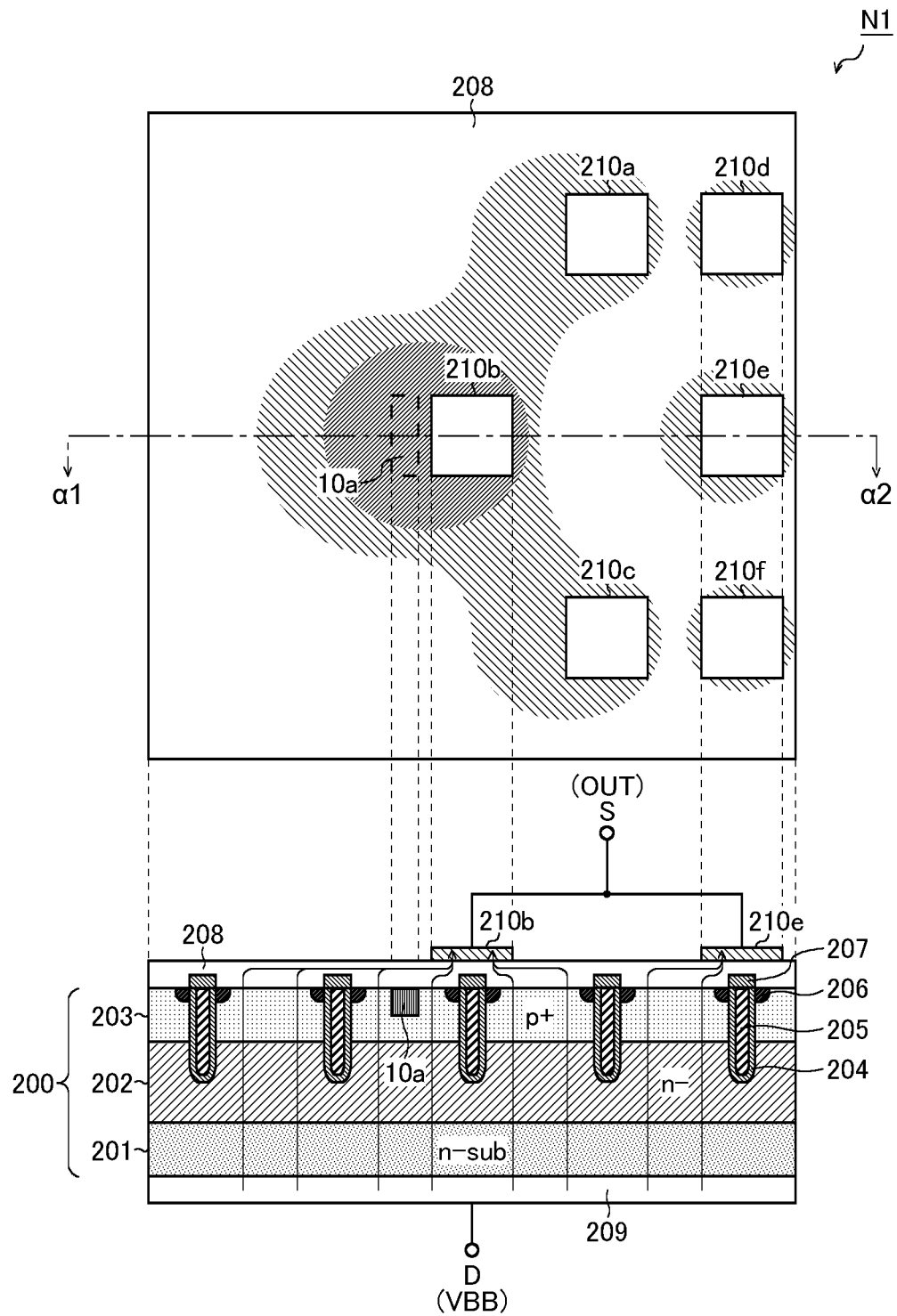
FIG. 4 is a schematic diagram showing a transistor N1 according to a third embodiment.

FIG. 4 is a schematic diagram showing the transistor N1 according to a third embodiment. The transistor N1 in this embodiment is based on that of the second embodiment (FIG. 3) described previously, and is characterized by a more ingenious arrangement layout of the pads 210a to 210f. Accordingly, such constituent elements of the third embodiment as find their counterparts in the second embodiment are identified by the same reference signs as in FIG. 3, and no overlapping description will be repeated; the following description focuses on features unique to the third embodiment.

According to the second embodiment described previously, it is possible to narrow down, out of all the pads 210a to 210f, those in which current tends to concentrate to three, namely the pads 210a to 210c. Through these pads 210a to 210c, current passes under the same conditions. Thus, it is not possible to completely deny the possibility of, due to manufacturing variations or the like in the transistor N1, a higher current passing in a concentrated manner in the pads 210a or 201c rather than in the pad 210b close to the temperature sensing element 10a.

To cope with that, in the transistor N1 in this embodiment, of the above-mentioned three pads 210a and 210c, only the pad 201b is arranged in a manner protruding toward the center (toward the left edge) of the source electrode 208. With this lopsided arrangement, the current that passes from the drain electrode 209 to the left half of the surface of the source electrode 208 passes into, of the pads 210a to 210f, the one 201b closest to the left edge of the source electrode 208, from its left-side direction.

Thus, the current density distribution around each of the pads 210a to 210f is such that a close left-side vicinity of the pad 210b is a region with the highest current density, and hence is the most heat-generating spot in the transistor N1. In view of this, in the illustrated example, the temperature sensing element 10a is formed in the power transistor formation region in a close left vicinity of the pad 210b.

As described above, by adopting the arrangement layout of the pads 210a to 210f according to this embodiment, it is possible to uniquely identify one pad 210b in which current tends to concentrate most, and thus to uniquely identify one most heat-generating spot at which to form the temperature sensing element 10a. It is thus possible to enhance the accuracy of the abnormal heat generation detection by the temperature sensing element 10a (and hence the reliability of the temperature protection circuit 10).

For the sake of convenient description, in FIGS. 3 and 4, current concentration pads and other pads are illustrated as if there is a significant difference between them in the current density around them. Excessive concentration of current in a particular pad, however, leads to local deterioration of a metal layer or a bonding wire, and therefore should in principle be avoided as much as possible.

In view of the above, the following can be said of the arrangement layout of the pads 210a to 210f: it is preferable that the pads 210a to 210f be arranged in an appropriately lopsided manner over the source electrode 208 such that there is a minimum necessary difference among the pads 210a to 210f in the current density around them, that is, such that, even with manufacturing variations and the like in the transistor N1, there is only so small a difference as not to reverse the relationship in terms of the magnitude of current density between current concentration pads and other pads.

<Power Transistor (Fourth Embodiment)>

Figure 5:
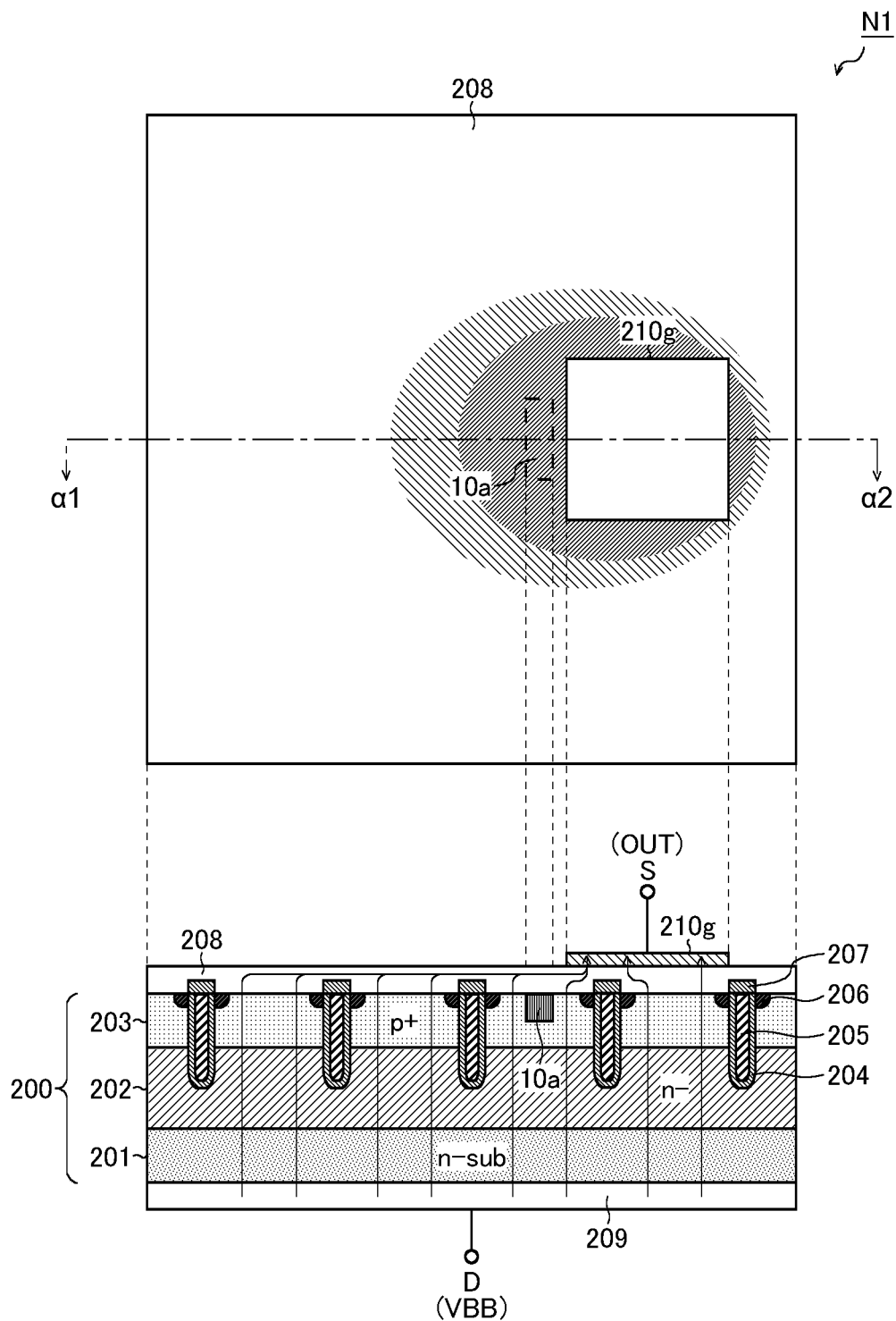
FIG. 5 is a schematic diagram showing a transistor N1 according to a fourth embodiment.

FIG. 5 is a schematic diagram showing the transistor N1 according to a fourth embodiment. The transistor N1 in this embodiment is based on that of the first embodiment (FIG. 2) described previously, and is characterized by the integration of the pads 210a to 210f into one pad 210g and in addition by an ingenious arrangement layout of the pad 210g. Accordingly, such constituent elements of the fourth embodiment as find their counterparts in the first embodiment are identified by the same reference signs as in FIG. 2, and no overlapping description will be repeated; the following description focuses on features unique to the fourth embodiment.

The pad 210g is a high-current pad to which a bonding wire with a large diameter (for example, several hundred micrometers) can be connected, and only one such pad is provided on the source electrode 208. In the illustrated example in particular, the pad 210g is arranged in a lopsided manner at a position deviated rightward across the plane of illustration from the center of gravity of the source electrode 208. Owing to this lopsided arrangement, the current density distribution around the pad 210g is not even in all directions, but a region with high current density lies in a manner lopsided in a particular direction (in the illustrated example, to the left side of the pad 210g), and hence that region is the most heat-generating spot in the transistor N1. In view of this, in the illustrated example, the temperature sensing element 10a is formed in the power transistor formation region in a close left-side vicinity of the pad 210g.

As described above, even in a case where one pad 210g is provided on the source electrode 208, by arranging it in a lopsided manner on the source electrode 208, it is possible to uniquely identify one region around the pad 210g in which current tends to concentrate most, and thus to uniquely identify one most heat-generating spot at which to form the temperature sensing element 10a. It is thus possible to enhance the accuracy of the abnormal heat generation detection by the temperature sensing element 10a (hence the reliability of the temperature protection circuit 10).

<Power Line>

Figure 6:
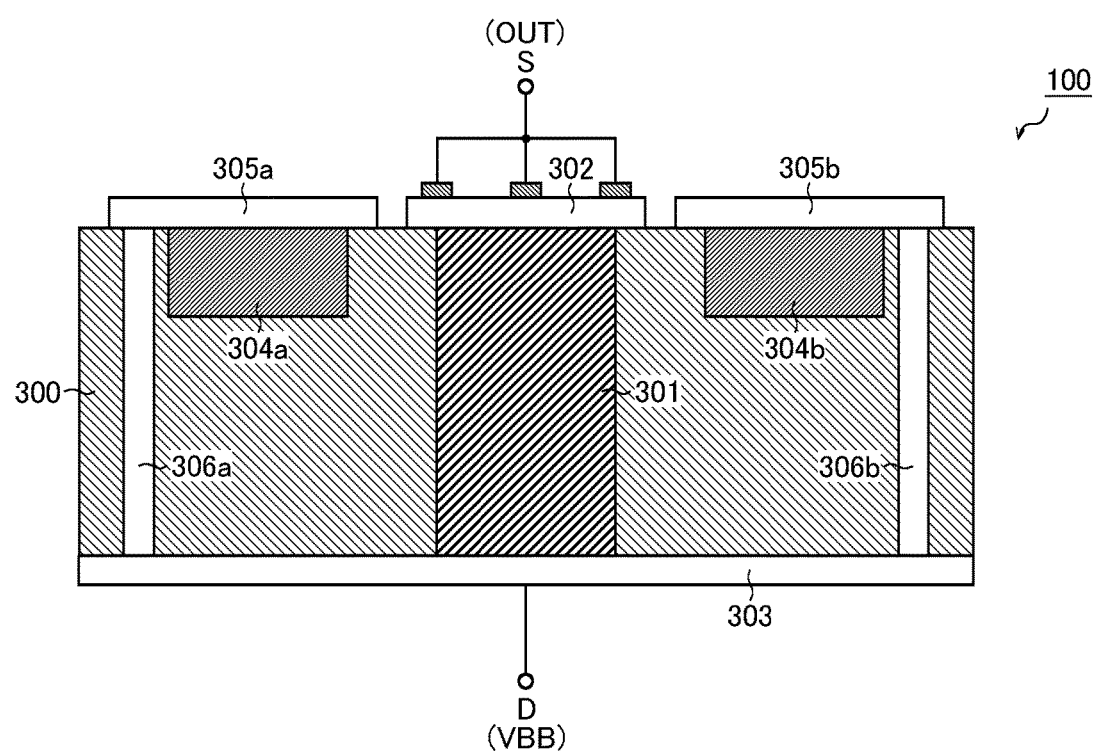
FIG. 6 is a schematic diagram showing an example of arrangement of a power line.

FIG. 6 is a schematic diagram showing an example of the arrangement of a power line in the semiconductor device 100. The semiconductor device 100 shown there includes a semiconductor substrate 300 (corresponding to the semiconductor substrate 200 in FIGS. 2 to 5) that has as its base an n-type semiconductor substrate layer.

The semiconductor substrate 300 has formed in it a power transistor formation region 301 (see the lower sections of FIGS. 2 to 5 respectively) in which the transistor N1 with a vertical structure is formed. On the obverse-face side (corresponding to the first-principal-face side) of the power transistor formation region 301, a source electrode 302 is formed. The source electrode 302 is connected via a pad to the OUT pin. On the other hand, on the reverse-face side (corresponding to the second-principal-face side) of the power transistor formation region 301, a drain electrode 303 is formed. The drain electrode 303 is connected to the VBB pin.

On the reverse side of the semiconductor substrate 300, over the entire surface, there is formed a substrate electrode (reverse-face electrode) for applying the supply voltage Vbb (the highest voltage in the system) to the n-type semiconductor substrate layer. Thus, the substrate electrode of the semiconductor substrate 300 can as it is be used as the drain electrode 303.

The semiconductor substrate 300 has formed in it, in addition to the power transistor formation region 301, also a plurality of circuit formation regions 304a and 304b. In those circuit formation regions 304a and 304b, there are formed circuit blocks (such as the internal power supply circuit 1 and the constant voltage generation circuit 2) that operate by being fed with the supply voltage Vbb.

Here, in a case where a power pad is provided on the obverse-face side of the semiconductor substrate 300 so that the supply voltage Vbb is fed from the power pad to the circuit formation regions 304a and 304b, depending on the arrangement layout of the circuit formation regions 304a and 304b, a situation may arise where a power line cannot be laid with the shortest distance from the power pad to the circuit formation regions 304a and 304b and instead a power line has to be laid around over an extra distance.

To avoid such a situation, in the semiconductor device 100 of this configuration example, on the obverse face of the semiconductor substrate 300, separate power lines 305a and 305b, independent of each other, are laid for the circuit formation regions 304a and 304b respectively; in addition, inside the semiconductor substrate 300, interlayer vias 306a and 306b are formed to connect between the substrate electrode (=the drain electrode 303) formed over the entire reverse face of the semiconductor substrate 300 and the power lines 305a and 305b respectively. It is preferable that the interlayer vias 306a and 306b be provided in the vicinity of the circuit formation regions 304a and 304b respectively.

With this configuration, the power lines 305a and 305b do not need to be laid around from the power pad. Thus, it is possible, irrespective of the arrangement layout of the circuit formation regions 304a and 304b, to minimize the distance over which the power lines 305a and 305b have to be laid.

Although FIGS. 2 to 6 deal with examples where a trench gate type is adopted for the vertical structure of the transistor N1, a planar gate type may instead be adopted for the vertical structure of the transistor N1.

Also in a case where the transistor N1 is given a horizontal structure, by arranging pads in a lopsided manner on an electrode, it is possible to properly determine the position at which to form the temperature sensing element 10a. This will now be discussed in detail with reference to FIG. 7.

<Power Transistor (Fifth Embodiment)>

Figure 7:
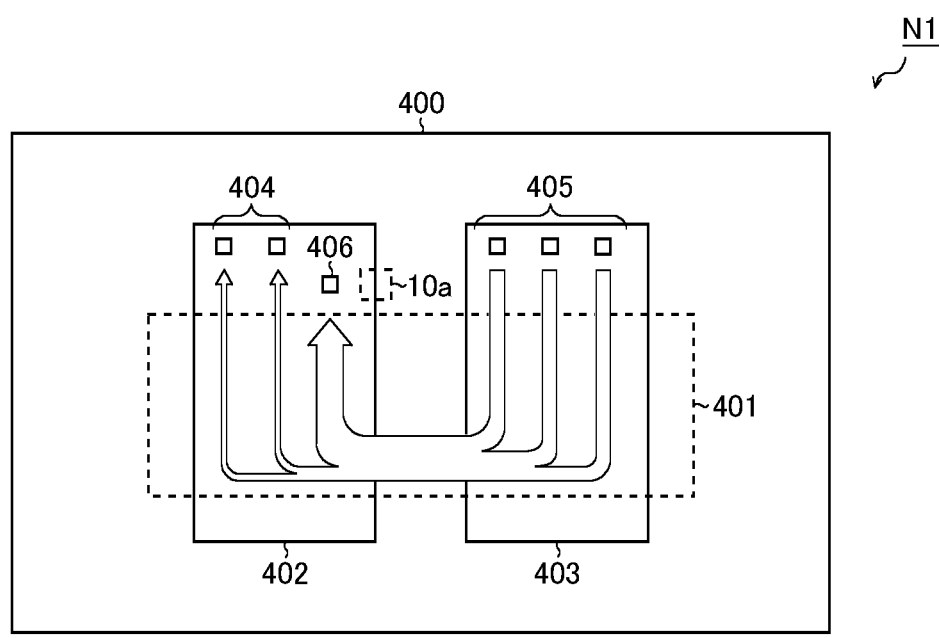
FIG. 7 is a schematic diagram showing a transistor N1 according to a fifth embodiment.

FIG. 7 is a schematic diagram (top view) showing the transistor N1 according to a fifth embodiment. The transistor N1 in this embodiment is a power transistor with a horizontal structure. The transistor N1 includes a semiconductor substrate 400, a channel region 401 which is formed on the semiconductor substrate 400, a source electrode 402 and a drain electrode 403 which are laid to extend from the channel region 401 toward edges of the semiconductor substrate 400, and pad rows 404 and 405 for wire bonding which are formed on those electrodes respectively. The transistor N1 further includes a current concentration pad 406 which is arranged on the source electrode 402 in a manner lopsided, compared with the pad row 404, toward the channel region 401.

Owing to the above-mentioned lopsided arrangement of the current concentration pad 406, the current that passes from the drain electrode 403 to the source electrode 402 passes in a concentrated manner into the current concentration pad 406 closest to the channel region 401. In the diagram, hollow arrows indicate the current that passes from the drain electrode 403 via the channel region 401 to the source electrode 402, the thickness of arrows representing the magnitude of current.

Thus, a vicinity of the current concentration pad 406 is a region with the highest current density, and hence is the most heat-generating spot in the transistor N1. In view of this, in the illustrate example, the temperature sensing element 10a is formed in the vicinity of the current concentration pad 406.

As described above, also in the transistor N1 with a horizontal structure, by arranging the current concentration pad 406 in a lopsided manner on the source electrode 402, it is possible to uniquely identify one most heat-generating spot at which to form the temperature sensing element 10a. It is thus possible to enhance the accuracy of the abnormal heat generation detection by the temperature sensing element 10a (hence the reliability of the temperature protection circuit 10).

<Application to a Low-Side Switch>

Figure 8:
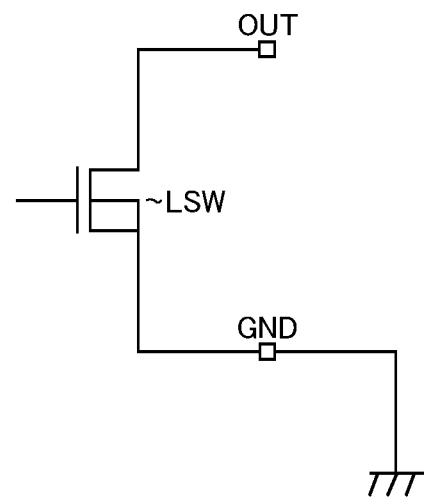
FIG. 8 is a circuit diagram showing an example of application to a low-side switch.

The description thus far has dealt with pad arrangement layouts for application to a high-side switch. The pad arrangement layouts described above, however, can be applied to a low-side switch (see FIG. 8).

Figure 9:
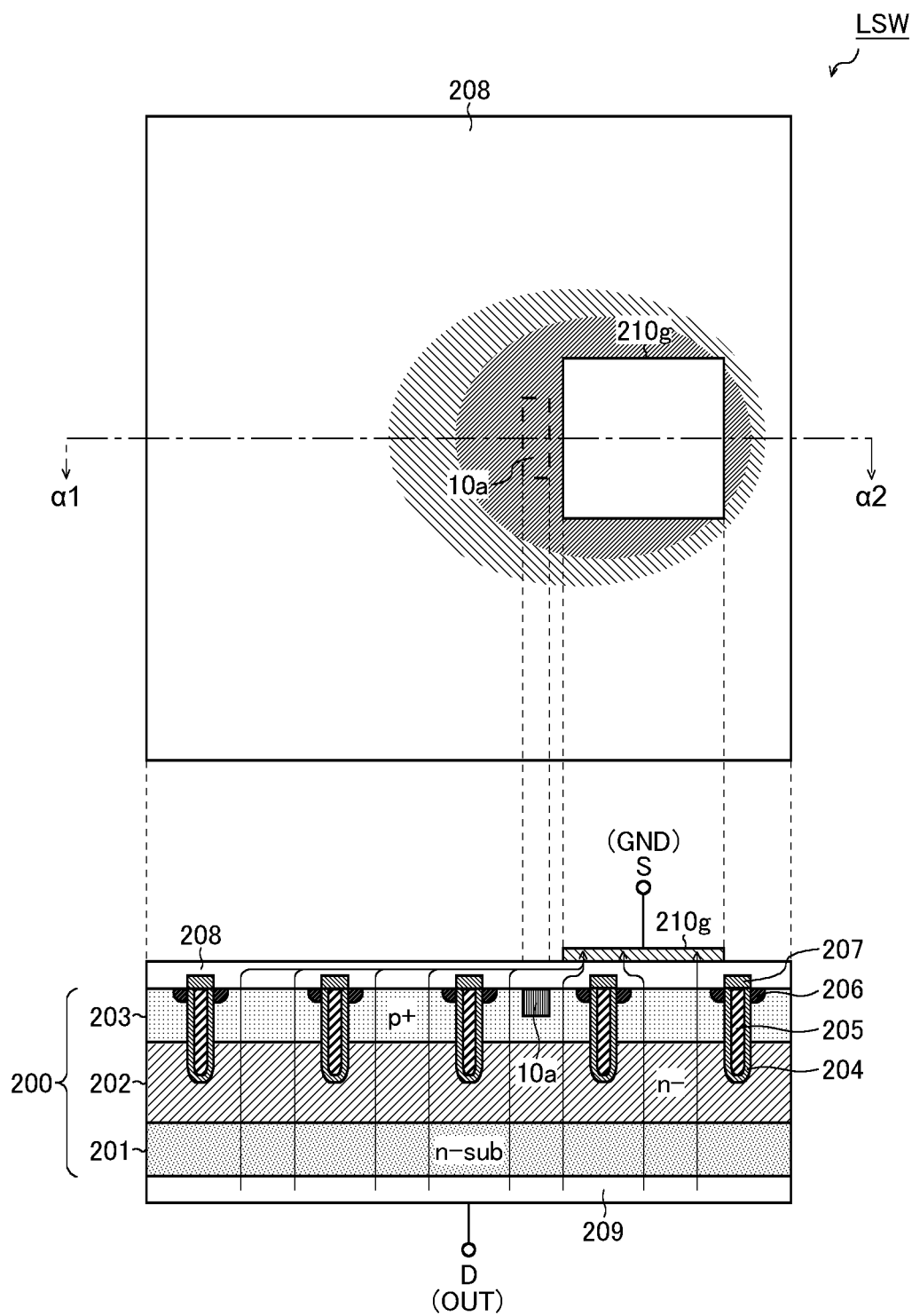
FIG. 9 is a schematic diagram showing an example of application to a low-side switch.

FIG. 9 is a schematic diagram showing an example of application to a low-side switch. Shown there as an example is a low-side switch LSW to which the same pad arrangement layout as in the fourth embodiment (FIG. 5) described previously is applied. As shown there, in a configuration applied to a low-side switch, a source electrode 210g (corresponding to a first electrode) is connected to the GND pin, and a drain electrode 209 (corresponding to a second electrode) is connected to the OUT pin.

<Power Transistor (Sixth Embodiment)>

Figure 10:
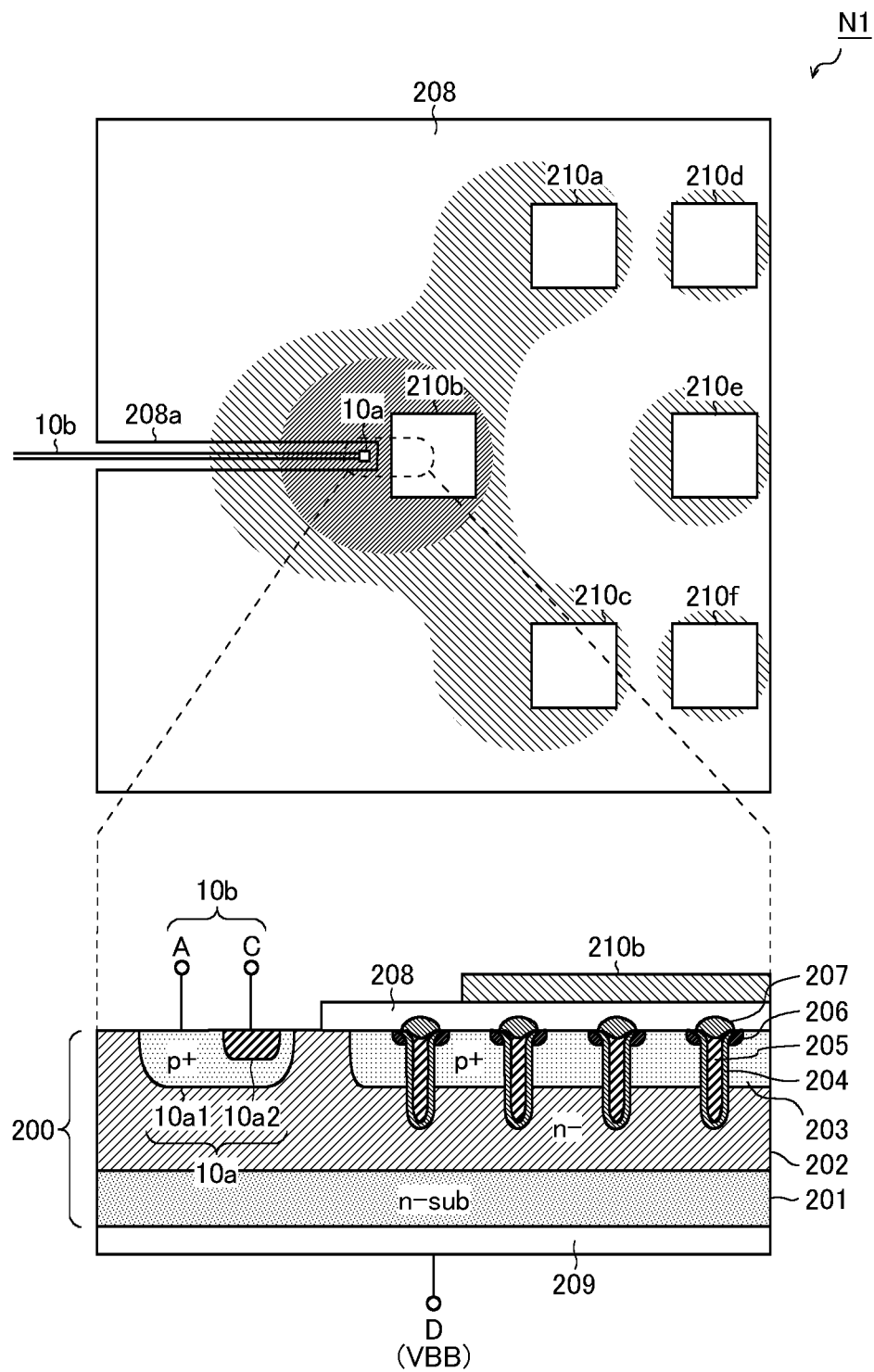
FIG. 10 is a schematic diagram showing a transistor N1 according to a sixth embodiment.

FIG. 10 is a schematic diagram showing the transistor N1 according to a sixth embodiment. This embodiment is based on the third embodiment (FIG. 4) described previously, and presents a more specific structure adapted to implementation. In a lower section of the diagram is a longitudinal sectional view of the broken-line region (=a region around a temperature sensing element 10a) in an upper section of the diagram.

As shown in the upper section of the diagram, on the source electrode 208, there is formed a slit 208a through which a metal conductor 10b is led from a temperature sensing element 10a provided in the vicinity of the pad 210b to an edge of the source electrode 208 itself. Thus, the temperature sensing element 10a is, strictly speaking, not embedded inside the transistor N1, but is arranged in a region where part of the transistor N1 is cut off (the region where the slit 208a is formed).

As seen from the temperature sensing element 10a, the slit 208a is formed along a straight line in the direction opposite to the pad 210b. With this configuration, it is possible to lead out the metal conductor 10b up to an edge of the source electrode 208 while cutting off as little of the current path to the pads 210a to 210f as possible.

Next, the vertical sectional view in the lower section of the diagram will be described. In this embodiment, as the temperature sensing element 10a, a diode is used. Specifically, in the low-doped n-type semiconductor layer 202, there is formed a high-doped p-type semiconductor region 10a1 which corresponds to the anode of a diode, and inside the high-doped p-type semiconductor region 10a1, there is formed a high-doped n-type semiconductor region 10a2 which corresponds to the cathode of the diode. In a diode formed with a pn junction in this way, the forward voltage drop Vf varies with the junction temperature Tj, making the diode suitable as the temperature sensing element 10a.

Next, a supplementary description will be given of the constituent elements of the transistor N1. As has thus far been described in connection with the embodiments, a plurality of trench gates form a unit cell, and a large number of such unit cells are connected in parallel to form one power transistor. For example, the pad 210b is so sized as to measure 70 μm or more along each side, and the trench gates have a width and an interval of several micrometers. Thus, as shown in the diagram, right under the pad 201b, there are a plurality of trench gates.

Although this embodiment has been described on the basis of the third embodiment (FIG. 4) described previously, structures similar to that described above can be adopted also in embodiments based on the first embodiment (FIG. 1), the second embodiment (FIG. 3), and the fourth embodiment (FIG. 5).

<IC Layout>

Figure 11:
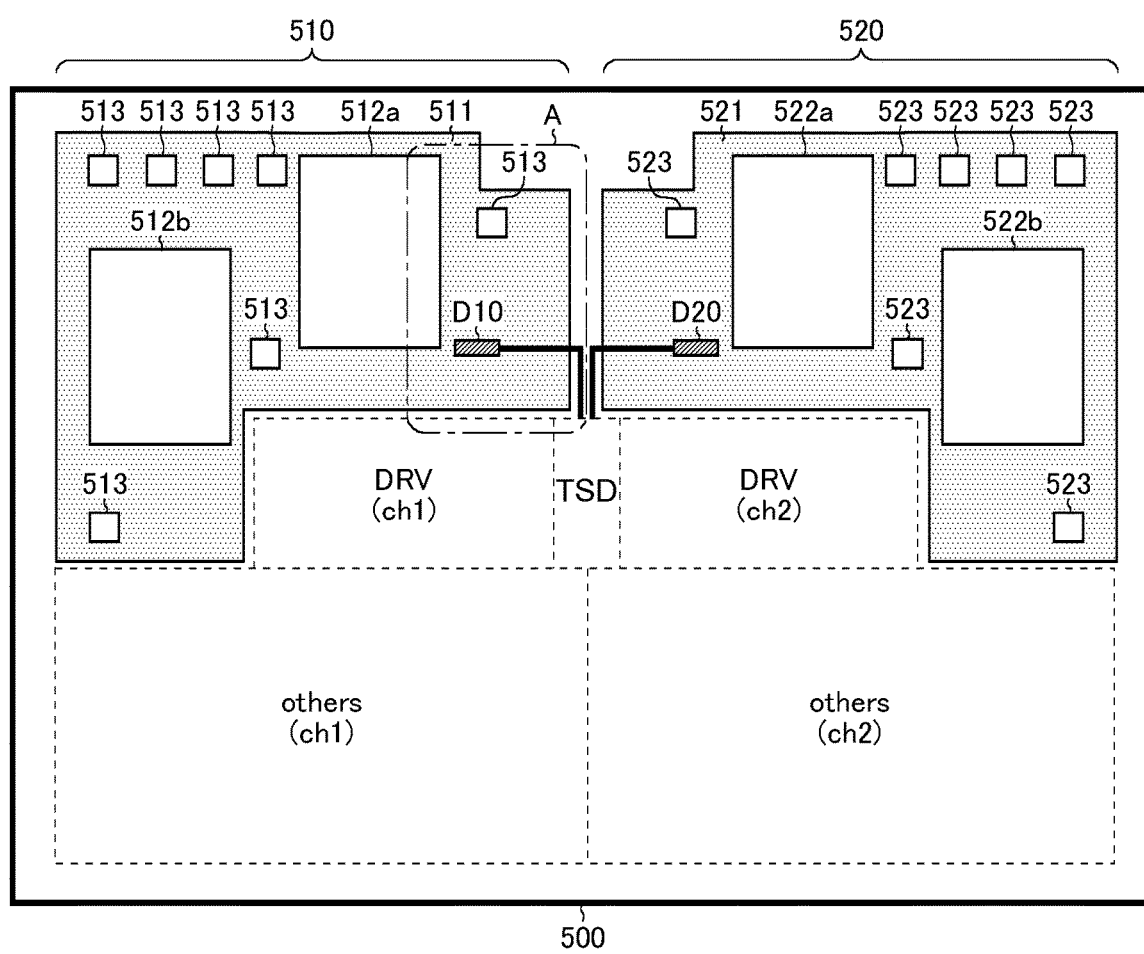
FIG. 11 is a schematic diagram showing one specific example of an IC layout.

FIG. 11 is a schematic diagram showing one specific example of the IC layout. The semiconductor device 500 shown there has integrated in it two channels of N-channel MOS field-effect transistors 510 and 520 (each corresponding to the transistor N1 described previously).

The transistors 510 and 520 are each arranged not in a central part, but in a part displaced toward an edge, of the semiconductor device 500. On the other hand, in a central part of the semiconductor device 500, there are formed a driver DRV (corresponding to the gate control circuit 6 and the like in FIG. 1) which, according to a control signal fed to it, turns ON and OFF the transistors 510 and 520 individually and a temperature protection circuit TSD (corresponding to the temperature protection circuit 10 in FIG. 1) which forcibly turns OFF both of the transistors 510 and 520 on detecting a temperature fault. In the remaining region of the semiconductor device 500, there are formed other circuit elements others (corresponding to the charge-pump circuit 4 and the like in FIG. 1).

The transistors 510 and 520 are each formed in an L shape as seen in a plan view of the semiconductor device 500. Adopting this layout helps obtain higher resistance to an inductive load such as an inductor.

Moreover, the transistors 510 and 520 are laid out symmetrically left to right as seen in a plan view of the semiconductor device 500. Adopting this layout helps obtain uniform characteristics and allows easy wiring.

Next, lopsided arrangement of pads in the transistor 510 will be described. On a source electrode 511 of the transistor 510, there are formed a plurality of (here, two) main pads 512a and 512b and a plurality of (here, seven) sub pads 513, the latter being smaller than the former.

Suppose, for example, that transistor elements (unit cells) are arranged evenly under the source electrode 511. Then, the current that passes out of those transistor elements concentrate in the pads (512a, 512b, and 513) arranged on the source electrode 511. When attention is paid to one transistor element, the conducting path of the current that passes in the transistor element is fixed by the arrangement positions of the pads. This is because current tends to pass along the shortest path (the path with the lowest resistance value).

That is, the innumerable current paths leading from the innumerable transistor elements constituting the transistor 510 to the pads (512a, 512b, and 513) are determined by the arrangement positions of the pads. In the formation region of the transistor 510, the spot where current concentrates most is the spot where the current paths form the transistor elements concentrate most. For example, from FIG. 12 (=an enlarged view of the broken-line region A in FIG. 11), it can be seen that the spot where current concentrates most on the source electrode 511 is a lower right corner P1 of the main pad 512a.

Specifically, the current that passes out of the transistor elements in an area zone1 all passes into the corner P1. On the other hand, for comparison with the corner P1, the lower right corner P2 of the sub pad 513 will now be considered. The current that passes out of the transistor elements in an area zone2 all passes into the corner P2. The area zone2 is identified by points x1 and x2 at both of which the distance from the right side of the main pad 512a and the distance from the corner P2 of the sub pad 513 are equal. As will be understood from FIG. 12, the area of the area zone1 is larger than the area of the area zone2, and thus the current density at the corner P1 is higher than the current density at the corner P2. By considering other pad corners in a similar manner as described above, it is possible to prove that, on the source electrode 511, the current density at the lower right corner P1 of the main pad 512a is the highest.

As described above, the pads (512a, 512b, and 513) are arranged on the source electrode 511 in a lopsided manner such that current concentrates most at the corner of the pad closest among them to the temperature protection circuit TSD.

It is preferable that the temperature sensing element D10 (corresponding to the temperature sensing element 10a described previously) for sensing the temperature of the transistor 510 be arranged at a spot in the formation region of the transistor 510 where heat tends to concentrate most. In the example in FIG. 12, as mentioned previously, current concentrates most at the lower right corner P1 of the main pad 512a, and thus it is preferable that the temperature sensing element D10 be disposed in the vicinity of that place.

Now, what is meant by "vicinity" will be explained by way of specific examples. For example, in FIG. 11, in a case where the length of the longer sides of the semiconductor device 500 (its length along the left-right direction on the plane of illustration) is 2.8 mm, the distance from the temperature sensing element D10 to the edge of the transistor 510 (=the right-side edge of the source electrode 511) can be, for example, 0.2 mm, and the distance from the temperature sensing element D10 to the main pad 512a can be, for example, 0.02 mm. That is, the distance from the temperature sensing element D10 to the main pad 512a can be designed to be about 5% to 20% (for example, 10%) of the distance from the temperature sensing element D10 to the edge of the transistor 510.

When the directions pointing from the lower right corner P1 of the main pad 512a to the right-side edge and the lower edge, respectively, of the source electrode 511 are referred to as the first direction (=the left-right direction on the plane of illustration) and the second direction (=the up-down direction on the plane of illustration), the temperature sensing element D10 can be arranged along, of the first and second directions, the direction along which the distance from the corner P1 to the relevant corner is longer.

Figure 12:
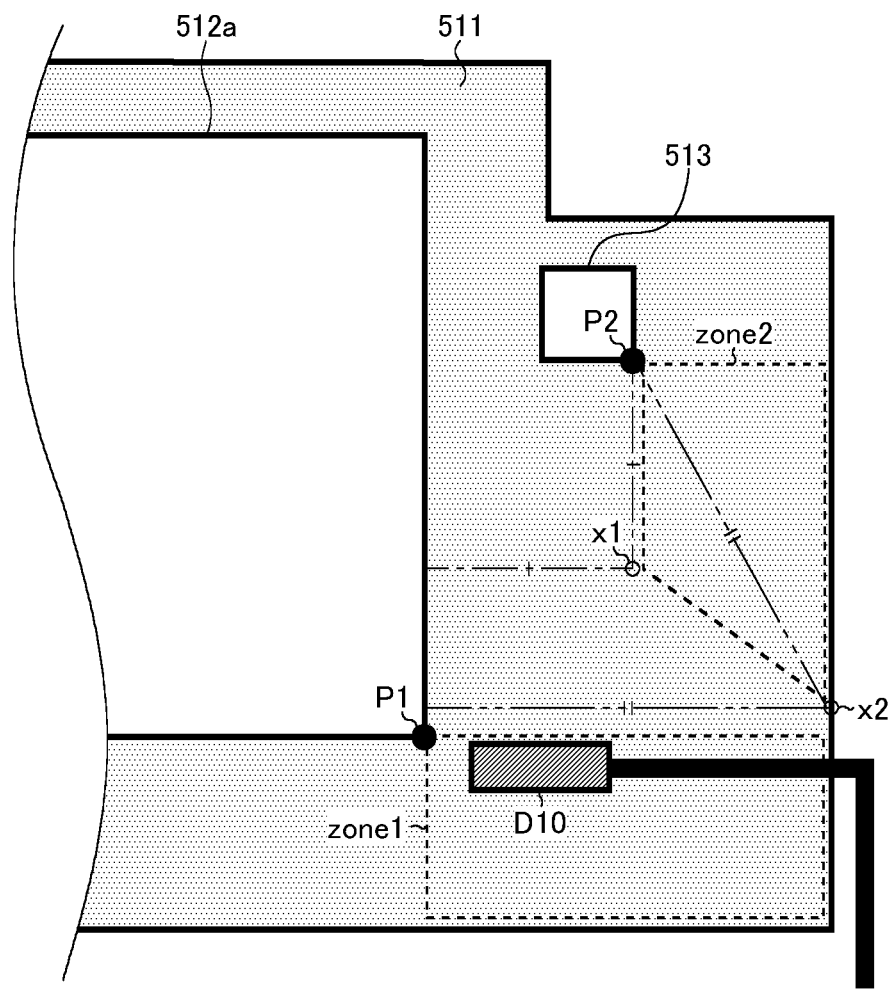
FIG. 12 is an enlarged view of the broken-line region in FIG. 11.

Though not shown in FIGS. 11 and 12, it is supposed that, as in FIG. 10 referred to previously, the source electrode 511 has a slit formed in it along a straight line so as to extend from the arrangement position of the temperature sensing element D10 to the right-side edge of the source electrode 511 itself.

Also for the transistor 520, an IC layout similar to that described above is adopted, except that the layout here is reversed left to right compared with the transistor 510. Accordingly, the description of the lopsided arrangement of pads in the transistor 510 can be understood, when the figure "1" at the place of tens in the reference sign appearing there is read as "2", as describing that in the transistor 520 as well.

<Application to a Vehicle>

Figure 13:
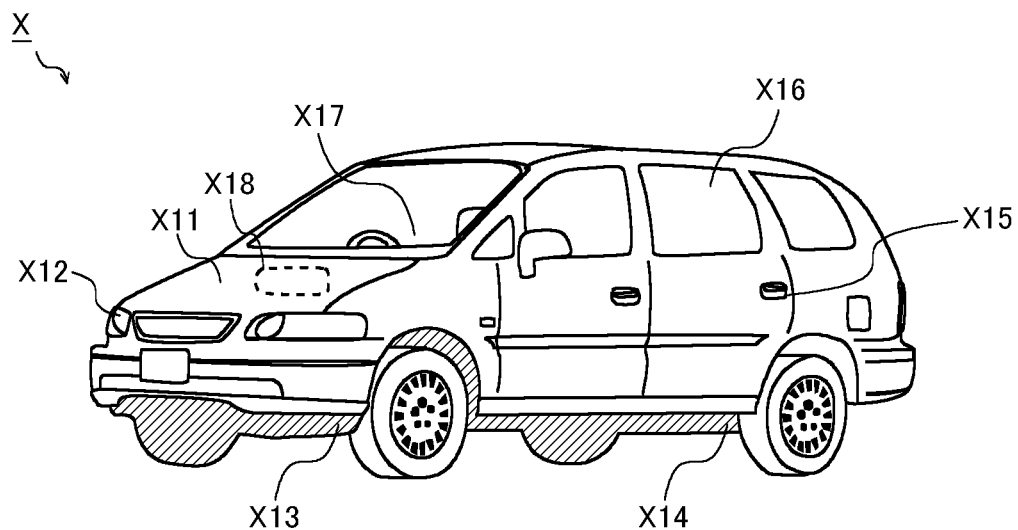
FIG. 13 is an exterior view of one configuration example of a vehicle.

FIG. 13 is an exterior view showing one configuration example of a vehicle. The vehicle X of this configuration example incorporates a battery (not shown in FIG. 13) along with various electronic appliances X11 to X18 that operate by being fed with a supply voltage Vbb from the battery. It should be noted that, for the sake of convenient illustration, any of the electronic appliances X11 to X18 shown in FIG. 13 may be located elsewhere in practice.

The electronic appliance X11 is an engine control unit which performs control with respect to an engine (injection control, electronic throttle control, idling control, oxygen sensor heater control, automatic cruise control, etc.).

The electronic appliance X12 is a lamp control unit which controls the lighting and extinguishing of HIDs (high-intensity discharged lamps) and DRLs (daytime running lamps).

The electronic appliance X13 is a transmission control unit which performs control with respect to a transmission.

The electronic appliance X14 is a body control unit which performs control with respect to the movement of the vehicle X (ABS (anti-lock brake system) control, EPS (electric power steering) control, electronic suspension control, etc.).

The electronic appliance X15 is a security control unit which drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as A/V (audio/visual) equipment, a car navigation system, and an ETC (electronic toll control system).

The electronic appliance X18 comprises electronic appliances provided with high-withstand-voltage motors, such as a vehicle-mounted blower, an oil pump, a water pump, and a battery cooling fan.

The semiconductor device 100 described previously can be built in any of the electronic appliances X11 to X18.

<Modifications>

Although the embodiments described above deal with, as examples, vehicle-mounted high-side switch ICs, this is not meant to limit the application of the invention disclosed herein; the present invention finds wide application in semiconductor devices in general that include a power transistor, examples including vehicle-mounted IPDs (intelligent power devices) intended for other uses (such as vehicle-mounted low-side switch ICs and vehicle-mounted power supply ICs).

Thus, the invention disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

The invention disclosed herein finds application in, for example, IPDs for mounting on vehicles.

LIST OF REFERENCE SIGNS

1 internal power supply circuit
2 constant voltage generation circuit
3 oscillation circuit
4 charge-pump circuit
5 logic circuit
6 gate control circuit
7 clamp circuit
8 input circuit
9 reference generation circuit
10 temperature protection circuit
10a temperature sensing element
10a1 high-doped p-type semiconductor region
10a2 high-doped n-type semiconductor region
10b metal conductor
11 reduced-voltage protection circuit
12 open protection circuit
13 overcurrent protection circuit
100 semiconductor device
200 semiconductor substrate
201 n-type semiconductor substrate layer
202 low-doped n-type semiconductor layer
203 high-doped p-type semiconductor layer
204 gate oxide film
205 gate polysilicon
206 high-doped n-type semiconductor regions
207 interlayer insulating film
208 source electrode (first electrode)
208a slit
209 drain electrode (second electrode)

210a to 210g pad
300 semiconductor substrate
301 power transistor formation region
302 source electrode
303 drain electrode (substrate electrode)
304a, 304b circuit formation region
305a, 305b power line
306a, 306b interlayer via
400 semiconductor substrate
401 channel region
402 source electrode
403 drain electrode
404, 405 pad row
406 current concentration pad
500 semiconductor device
510, 520 N-channel MOS field-effect transistor
511, 521 source electrode
512a, 512b, 522a, 522b main pad
513, 523 sub pad
D10, D20 temperature sensing element (diode)
N1 N-channel MOS field-effect transistor (power transistor)
N2 N-channel MOS field-effect transistor (current sensing transistor)
N3 N-channel MOS field-effect transistor (signal output transistor)
R1, R2 resistor
Rs sense resistor
Z1, Z2 Zener diode
LSW low-side switch
X vehicle
X11 to X18 electronic appliance

What is claimed is:

1. A semiconductor device comprising:
a power transistor; and
a temperature sensing element configured to detect heat generation in the power transistor,
wherein
the power transistor includes:
a first electrode formed on a first-principle-face side of a semiconductor substrate; and
a plurality of pads located upon the first electrode in thickness direction of the semiconductor device so as to be connected to the first electrode electrically and arranged in a lopsided manner on the first electrode, and
the temperature sensing element is disposed in a vicinity of one pad among the plurality of pads, the one pad located in an area with the smallest number of pads per unit area in plan view of the semiconductor device.

2. The semiconductor device according to claim 1, wherein the pads are arranged in a lopsided manner such that the one pad on which current tends to concentrate most is uniquely identifiable.

3. The semiconductor device according to claim 1, wherein the second electrode is a substrate electrode for applying a supply voltage to the semiconductor substrate.

4. The semiconductor device according to claim 3, further comprising:
a power line formed on the first-principle-face side of the semiconductor substrate; and
a via connecting between the substrate electrode and the power line.

5. The semiconductor device according to claim 1, wherein the power transistor is configured to function as a high-side switch of which the first electrode is connected to a load and of which the second electrode is connected to a power terminal.

6. The semiconductor device according to claim 1, wherein the power transistor is configured to function as a low-side switch of which the first electrode is connected to a ground terminal and of which the second electrode is connected to a load.

7. The semiconductor device according to claim 1, wherein the first electrode has formed therein a slit through which a conductor from the temperature sensing element is led up to an edge of the first electrode.

8. The semiconductor device according to claim 7, wherein
the temperature sensing element is disposed in a vicinity of the one pad, and
the slit is formed to extend in a direction opposite to the one pad.

9. The semiconductor device according to claim 2, wherein the plurality of pads are arranged in a lopsided manner on the first electrode such that current concentrates most at a corner of the one pad, that is closest to a temperature protection circuit.

10. The semiconductor device according to claim 9, wherein the temperature sensing element is disposed in a vicinity of the corner.

11. The semiconductor device according to claim 9, wherein the temperature sensing element is arranged along, of a plurality of directions pointing from the corner to edges of the first electrode, a direction along which a distance from the corner to an edge is longer.

12. The semiconductor device according to claim 9, wherein the plurality of pads comprises a main pad and a sub pad, the sub pad being smaller than the main pad.

13. The semiconductor device according to claim 1, further comprising:
a temperature protection circuit configured to forcibly turn OFF the power transistor when the temperature sensing element detects abnormal heat generation in the power transistor.

14. An electronic appliance comprising:
the semiconductor device according to claim 13.

15. A vehicle comprising:
a battery; and
the electronic appliance according to claim 14, the electronic appliance operating by being fed with a supply voltage from the battery.

16. The semiconductor device according to claim 1, wherein the temperature sensing element is arranged near the center of one side of the one pad.

* * * * *